United States Patent [19]

Hewig et al.

[11] Patent Number: 4,812,416
[45] Date of Patent: Mar. 14, 1989

[54] METHOD FOR EXECUTING A REPRODUCIBLE GLOW DISCHARGE

[76] Inventors: Gerd Hewig, Kastanienweg 15a, D-8755 Alzenau; Berthold Schum, Bornweg 44, D-6465 Biebergemünd; Jörg Wörner, Philipp-Reis-Strasse 16, D-6451 Grosskrotzenburg, all of Fed. Rep. of Germany

[21] Appl. No.: 936,089

[22] Filed: Nov. 28, 1986

[30] Foreign Application Priority Data

Nov. 28, 1985 [DE] Fed. Rep. of Germany ....... 3542111

[51] Int. Cl.$^4$ ............................................. H01L 31/18
[52] U.S. Cl. .................................. 437/5; 136/260; 156/626; 204/192.33; 427/8; 427/39; 437/8
[58] Field of Search ............... 29/572, 574; 156/626, 156/627, 643; 204/192.33; 136/258 AM, 260; 427/8, 39; 134/1, 21; 437/2, 4, 5, 8

[56] References Cited

U.S. PATENT DOCUMENTS 4,362,936 12/1982 Hofmann et al. .................. 250/292

FOREIGN PATENT DOCUMENTS 0091998 10/1983 European Pat. Off. ............ 136/260
2947542 4/1981 Fed. Rep. of Germany ...... 156/643
57-169241 10/1982 Japan ................................ 156/627

OTHER PUBLICATIONS

J. E. Daley et al, *IBM Tech. Disc. Bull.*, vol. 20, No. 11B, Apr. 1978, p. 4802.
B. A. Raby, *J. Vac. Sci. Technol.*, vol. 15, Mar./Apr. 1978, pp. 205-208.
B. S. Meyerson, et al, The Preparation of in Situ Doped Hydrogenated Amorphous Silicon by Homogeneous Chemical Vapor Deposition, J. Appl. Phys. 54(3) Mar. 1983, pp. 1461-1465.
C. I. M. Beenakker, et al, Decomposition and Product Formation in $CF_4$-$O_2$ Plasma Etching Silicon in the Afterglow, J. Appl. Phys. 52(1), Jan. 1981, pp. 480-485.

*Primary Examiner*—Aaron Weisstuch
*Attorney, Agent, or Firm*—Cushman, Darby & Cushman

[57] ABSTRACT

In order to be able to check whether or not a glow procedure is executed properly, i.e. reproducibly, the temporal course of the formation of characteristic stable reaction products is traced mass spectrometrically.

9 Claims, 2 Drawing Sheets

METHOD FOR EXECUTING A REPRODUCIBLE GLOW DISCHARGE

BACKGROUND OF THE INVENTION

This invention relates to a method for executing a reproducible glow discharge process in which the formation of characteristic volatile stable products that are formed during the reaction with a reactant located in the reaction space can be traced mass spectrometrically.

Glow discharge processes are used, among other purposes, in the manufacture of solar cells for the formation as well as the removal of films. For example, promation of a film is known from DE-OS No. 21 52 895, in which the efficiency of a copper-sulphide/cadmium-sulphide thin film solar cell is increased by adding to the copper-sulphide layer another layer containing copper that is thin in comparison to the copper-sulphide layer. During this process, the amount of copper needed for the additional layer can be produced via the reduction of the copper sulphide on the surface, namely, through treatment in a glow discharge in a hydrogen atomsphere. The removal of layers for the manufacture of efficient solar cells is known, for example, in connection with inversion-layer solar cells. Glow processes are also used in cleaning reaction spaces that are used for the manufacture of a-Si solar cells. In this case, the glow discharge serves to clean, the polysilane or polymers of doping gases, such as $PH_3$ and $B_2H_6$, which are present in the react ion space by etching them away with fluorine compounds. Glasses can also be cleaned in a glow process.

The procedural regulation of glow processes, such as continuous and adjusted gas pressure, is based typically on experimental values. Thus without a consistent way of measuring the reaction, glow processeses do not lead to the desired results.

SUMMARY OF THE INVENTION

The object of the present invention is to develop a method so that knowledge regarding the reaction of the ions present in the glow discharge with the reactants is obtainable and conclusions as to the quality of the resultant reaction between the ions and the reactant can be drawn immediately during the process.

The problem is solved by teaching mass spectrometrically the temporal course of the formation of stable reaction products, preferably outside of the reaction space.

In accordance with the invention, the temporal course of the glow discharge process itself is traced. During this time the ions produced in the plasma react with the reactant. In this case, the reactant can be a heterogeneous solid consisting of several layers and comprising materials of various grain sizes, with grain boundaries thus running between them. Since the temporal course is determined, conclusions can be drawn immediately during the process—as well as after the process as to whether the reactant has reacted with the ions to the desired extent, or, put differently, whether it has undergone the desired chemical change. Consequently the specific structure of the reactant can be optimally derived by means of the method in accordance with the invention.

The temporal course of the formation of volatile reaction products gives rise to a characteristic curve which permits conclusions to be drawn about the glow process as to whether the desired course of the reaction has been attained through the process According to one embodiment, a reaction space used for the manufacture of a-Si solar cells is scavenged with fluorine compounds in order to remove polysilanes by means of etching. This embodiment is characterized by the tracing of the temporal course of the partial pressures of the volatile $SiF_4$ and/or $PF_5$ and/or $BF_3$ compounds that are produced during etching.

The $SiF_4$ characteristic curve derived from this method exhibits a maximum value and the partial pressure of the $SiF_4$ does not change substantially after the polysilanes have been etched away. If the glow process is interrupted at this point, one can avoid undesired contamination of the reaction space by scavenging for too long a time with fluorine compounds. Enriching the fluorine ions in the reaction space unnecessarily is thus avoided. This would otherwise lead to an uncontrollable damage in the manufacture of a-Si solar cells. Etching itself can take place with fluorine compounds such as $CF_4$, $SF_6$ or $NF_3$ gases, which react with the silicon of the polysilanes as follows:

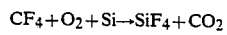

$$CF_4 + O_2 + Si \rightarrow SiF_4 + CO_2$$

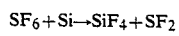

$$SF_6 + Si \rightarrow SiF_4 + SF_2$$

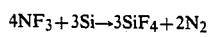

$$4NF_3 + 3Si \rightarrow 3SiF_4 + 2N_2$$

In another embodiment, glass substrates are washed in several washing stages by using solutions that contain tensides and by using organic solvents, in particular, water-free alcoholic vapors undergoing condensation on the substrate. Very often a final washing step is appropriate immediately prior to a final deposition process in order to remove hydrocarbonic remains from the surface. Oxidation processes are very suitable for this purpose, since they are based on the formation of volatile reaction products.

For these reasons, the method in accordance with the invention can also be used for the final washing of glass materials and is characterized by tracing mass spectrometrically the temporal course of the partial pressures of $CO$, $CO_2$ and/or $CH_4$ as volatile reaction products in order to achieve a reproducible execution of the glow procedure.

A special application of the invention is in the processing of semiconductive compounds as $Cu_2S$, $Cu_2Se$, $CdTe$, $ZnTe$, $CuInSe_2$ or transparent front contacts such as ITO (indium tin oxide). These semiconductors are used in the production of photovoltaic cells and the last one also for LCD's. For example, to obtain a $Cu_{2-x}S/CdS$ thin film solar cell with $0 \leq x \leq 1$, the $Cu_{2-x}S$ layer is exposed to a glow discharge in a hydrogen atomsphere. The invention is characterized in particular by the following steps:

(a) reduction in the glow discharge of the $Cu_{2-z}O$ present on the $Cu_{2-x}S$ layer with $0 < z \leq 1$ and the excess sulphur ions from the $Cu_{2-x}S$ layer until a highly stoichiometric $Cu_{2.0000}S$ layer is attained which is the p-semiconductor.

(b) formation of a inversion layer on and from the highly stoichiometric $Cu_{2.0000}S$ layer by means of adsorption of $H^-$ ions from the hydrogen atomsphere of the glow discharge:

(c) reduction of the free surface of the inversion layer to elemental copper in which case the temporal course of the glow discharge process is set in such a way that the $H_2S$ partial pressure resulting from the reduction of the $Cu_{2-x}S$ layer, measured in a continuously changing hydrogen atmosphere, first increases sharply and, after reaching a maximum value, decreases sharply again (range I), with the maximum value being shifted towards the shorter time period, which results in a subsequent gradual decrease in the $H_2S$ partial pressure to a minimum value (range II), which is then followed by an almost continuous increase in the $H_2S$ partial pressure (range III). So long as a glow is not applied in the exchanged hydrogen atmosphere, a sharp increase occurs in the period of time corresponding to that of range I (range Ia), and then a plateau is reached and traversed (range IIa). Subsequently the $H_2S$ partial pressure continues to increase steadily (range IIIa).

In particular, the glow process is set in such a way that the ratio of the area of range I to that of range II is $A_I:A_{II} = (2.5 +/- 0.5) : 1$ (in exchanged hydrogen atmosphere).

BRIEF DESCRIPTION OF THE DRAWINGS

In the following the invention is described in detail with reference to the drawings, from which further details, advantages and features can be seen.

DETAILED DESCRIPTION OF THE PREFERRED EMBODIMENT

The manufacture of amorphous silicon solar cells occurs in a reaction vessel that is provisionally contaminated with polysilanes or polymers of the doping gases such as $PH_3$ and $B_2H_6$ through the manufacturing process. These impurities, however, must be removed in order to be able to manufacture perfectly functioning a-Si solar cells. When removing the impurities, it is known practice to flood the reaction space with etching gases such as $CF_4 + O_2$ and $SF_6$, and $NF_3$ in order to etch away the polysilanes during the glow discharge process. When this is done, the following basic reactions occurs:

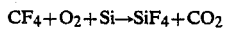

$$CF_4 + O_2 + Si \rightarrow SiF_4 + CO_2$$

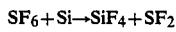

$$SF_6 + Si \rightarrow SiF_4 + SF_2$$

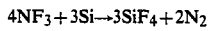

$$4NF_3 + 3Si \rightarrow 3SiF_4 + 2N_2$$

To make sure that the polysilanes are supplied with only as much fluorine as is necessary for them to be bound by the silicon, that is, that $SiF_4$ as volatile reaction products are produced, the partial pressure of the $SiF_4$ is observed in accordance with the invention in order to influence the glow discharge process in conjunction with the change of the partial pressure and thus clean the reaction vessel effectively. For if the reaction vessel were to be supplied with an unnecessarily large number of fluorine compounds without knowning the amount of polysilanes being removed, then the vessel would be contaminated by the fluorine compounds, which, in turn, would have a negative effect on the manufacture of a-Si solar cells as well. That means that the amount of caustic gas has to be optimized in its quantity according to the amount of impurities present in the vessel. This optimization can be achieved by the invention.

Figure 1:
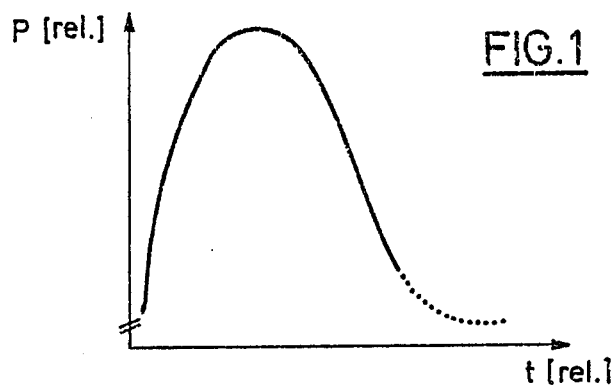
FIG. 1 represents the temporal course of the partial pressure of $SiF_4$ during a glow discharge process.

As FIG. 1 illustrates, the temporal course of the partial pressure of $SiF_4$ portrays a course that begins with small values, reaches a maximum and then decreases again. As soon as it is mass spectrometrically ascertained that a substantially change in the $SiF_4$ partial pressure will no longer occur, scavenging of the reaction space with fluorine compounds will be interrupted along with the glow discharge process. In this case it is made certain that the reaction space has been sufficiently cleaned without there being fluorine compounds present that adversely influence the manufacture of a-Si solar cells.

An appropriate etching process by way of glow discharge with gases containing fluorine compounds occurs preferentially at a pressure in the reaction vessel of approximately 0.2 to 0.3 mbar (20 to 30 Pa).

Figure 2:
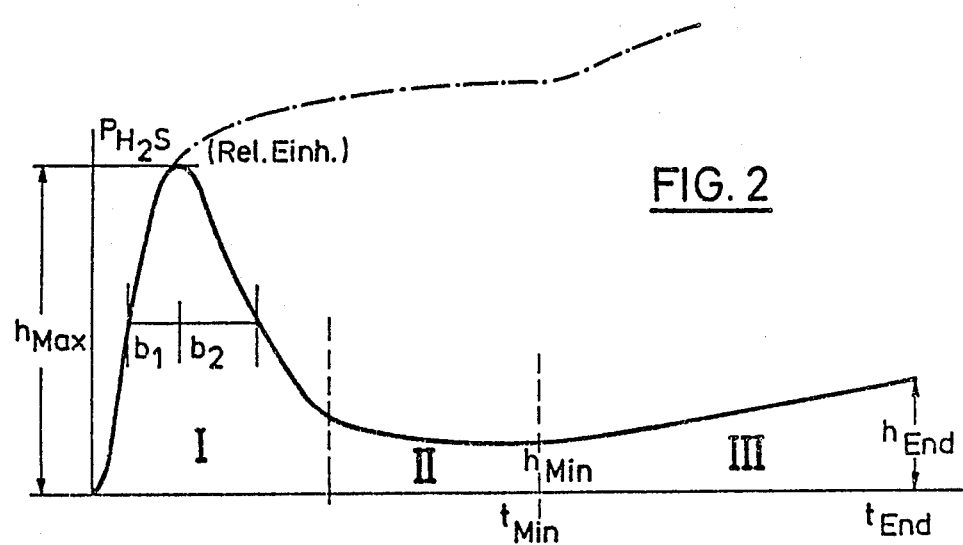
FIG. 2 represents the temporal course of the partial pressure of $H_2S$ in the manufacture of a copper-sulphide/cadmium-sulphide thin film solar cell in a glow discharge process in accordance with the invention.
Figure 3:
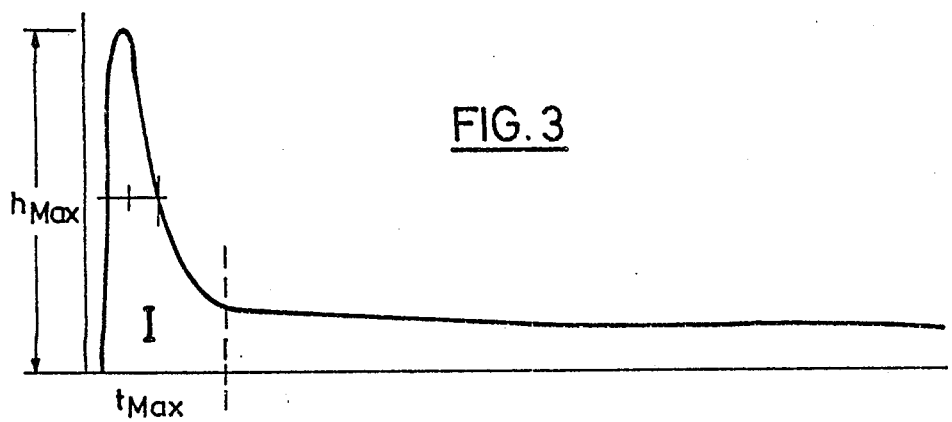
FIG. 3 represents the partial pressure of $H_2S$ in the manufacture of a copper-sulphide/cadmium-sulphide thin film solar cell in a glow discharge process which is not in accordance with the invention.
Figure 4:
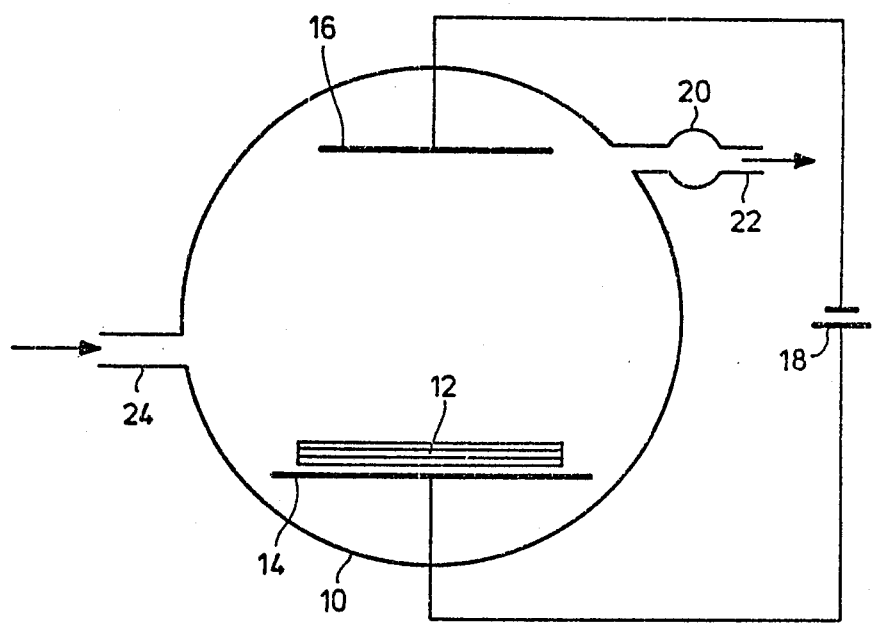
FIG. 4 represents an apparatus for the manufacture of a copper-sulphide/cadmium-sulphide thin film solar cell with the glow discharge process.

With reference to FIGS. 2 to 4, a glow discharge process is described which is used in the manufacture of copper-sulphide/cadmium-sulphide thin film solar cells in order to produce a highly stoichiometric copper-sulphide layer that does not exhibit degradation.

A solar cell (12) that comprises at least a substrate, an electrically conducting back contact and a cadmium-sulphide/copper-sulphide layer is arranged in a glow discharge chamber (10) and positioned near an anode (14) that is positioned opposite to a cathode (16). A voltage source (18) is located between anode (14) and cathode (16). In order to perform the glow discharge process, the glow discharge chamber (10) is first evacuated to a pressure of approx. $10^{-6}$ mbar ($10^{-4}$ Pa). Subsequently a controlled flooding with hydrogen occurs so that a constant pressure of circa 0.5 mbar (50 Pa) is reached. Then the glow discharge process is conducted at an applied voltage of 300 volts and a current that leads to a current density of 10 $\mu A/cm^2$ semiconductor layer. First, the copper oxide present on the copper-sulphide layer is completely reduced in the positive column of the glow discharge by way of the hydrogen radicals or, as the case may be, the $H^-$ ions. At the same time, excess sulphur ions are removed from the copper-sulphide layer. This reduction can be recognized by means of the partial pressure of the $H_2S$, which is determined by way of a mass spectrometer (20) that is located in an outlet pipe (22). Via the outlet pipe (22), hydrogen gas is continuously removed from the flow vessel (10), which is fed an equal amount of hydrogen gas via the inlet pipe (24). The gas stream is selected in such a way that the vessel (10) is completely filled with new hydrogen gas, preferably twice per minute, without the internal pressure of approx. 0.5 mbar (50 Pa) changing in the process.

If, in accordance with the invention, the copper-oxide and copper-sulphide layers are reduced, leading to the formation of a highly stoichiometric layer, i.e. a $Cu_{2.0000}S$ layer, then this can be ascertained by referring to the partial pressure of the hydrogen sulphide, which is determined by means of the mass spectrometer (20).

An appropriate course can be seen in FIG. 2. This range is designated by Roman numeral I. It can be seen that the curve rises sharply, reaches a maximum value and then falls sharply. Here the maximum is shifted toward the shorter time period with respect to the half-width of the curve. In range II, the H$_2$S partial pressure decreases slightly and then reaches a minimu. In this range, the surface layer of the Cu$_{2.0000}$S layer is transformed into an inversion layer through adsorption by a reducing agent (H$^-$). The charge carriers that determine the efficiency of a solar cell, i.e. electrons or holes, can tunnel their way through this inversion layer, whereas ions cannot.

After passing through the range II, the partial pressure of the H$_2$S increases slightly. In this range, sulphur is taken from the surface of the copper sulphide inversion layer producing H$_2$S. This leads to the production of elemental copper, which is then transformed in controlled fashion by means of a tempering process into a copper-oxide layer through which the charge carriers from the high-ohmic Cu$_{2.0000}$S layer flow more readily to a front contact.

If the glow discharge process does not run properly, i.e. not in accordance with the invention, then the result is not the formation of ranges I, II, and III, which are described above, but rather the curve depicted in FIG. 3. It can be seen that range I is shorter in comparison with a properly running glow discharge process and that the maximum is not shifted toward the shorter-period of time with respect to the half-width of the curve. The formation of ranges II and III does not occur. (Ranges II and III are now a single range alongside range I.) The area ratio $A_I:(A_{II}+A_{III})$ corresponds to a ratio of approx. 1:2. Thus it can be concluded from a corresponding curve that the copper-sulphide/cadmium-sulphide solar cell is not highly stoichiometric with regard to the copper-sulphide layer and that an inversion layer has not beendeveloped to a degree necessary to insure semipermeability regarding the charge carriers or ions. In addition, by comparing FIGS. 2 and 3 it can be seen that the range-I areas for properly and improperly executed glow discharge processes result in a ratio of approximately $$\frac{A_I \text{ properly executed}}{A_I \text{ improperly executed}} = \frac{3.25 +/- 0.75}{1}$$

Through this ratio it also becomes clear that in a properly run procedure a reduction has taken place in the entire Cu$_{2-x}$S material, whereas, in an improperly run procedure, merely the surface layer has been reduced.

Furthermore, in FIG. 2 the broken line indicates how the H$_2$S partial pressure will run if the atmosphere of the glow vessel is not exchanged during the glow discharge process.

A glow discharge process can thus be verifiably controlled by simple means by way of the theory in accordance with the invention so that the intended reactions during the course of the glow discharge process will taken place optimally.

We claim:

1. Method for the execution of a reproducible glow discharge process by tracing mass spectrometrically the temporal course of the partial pressure of volatile stable reaction products in the plasma with a reactant located in a glow discharge column for the manufacture of a Cu$_{2-x}$S/CdS thin film semiconductor solar cell with $0 \leq x \leq 1$, in which the Cu$_{2-x}$S layer is exposed to a glow discharge process in a hydrogen atmosphere, which includes the steps of:
   (a) reduction by the glow discharge of Cu$_{2-z}$O with $0 \leq z \leq 1$ present on the Cu$_{2-x}$S layer and of excess sulphur ions from the Cu$_{2-x}$S layer until a highly stoichiometric Cu$_{2.0000}$S layer is produced;
   (b) formation of an inversion layer on and from the highly stoichiometric Cu$_{2.0000}$S layer by way of adsorption of negatively charged hydrogen atoms (H$^-$ ions) from the hydrogen atmosphere of the glow discharge; and
   (c) reduction of the free surface of the inversion layer to elemental copper.

2. Method according to claim 1, wherein the reduction is executed in the positive column of the glow discharge.

3. Method according to claim 1, wherein the glow discharge process for the formation of the inversion layer occurs in an evacuated space that is first set at a pressure p$\sim$10$^{-6}$ mbar (10$^4$ Pa) and that the space is subsequently flooded with hydrogen for attaining a pressure of 0.5 mbar (50 PA) in order to execute the glow discharge process.

4. Method according to claim 3, wherein the glow discharge process occurs at a current density of 10 $\mu$A/cm$^2$ of semiconductor layer at a voltage of 300 V applied between the electrodes.

5. Method according to claim 1, wherein the hydrogen atomsphere of the glow space is exchanged during the glow discharge process without altering the internal pressure.

6. Method according to claim 5, wherein the exchange occurs approximately twice per minute.

7. Method according to claim 1, wherein the temporal course of the glow process is set in such a way that the H$_2$S partial pressure resulting fromthe reduction of the Cu$_{2-x}$S layer, measured in a continuously exchanging atmosphere, first increases sharply and, after reaching a maximum, decreases sharply again (range I) with the maximum being shifted toward the shorter period, followed by a gradual decrease in the H$_2$S partial pressure until a minimum is reached (range II), and after which the H$_2$S partial pressure increases almost continuously (range III).

8. Method according to claim 7, wherenthe ratio of the area of range I to that of range II is $A_I:A_{II}=(2.5+/-0.5):1$.

9. Method for the execution of a reproducible glow discharge process by tracing mass spectrometrically the temporal course of the partial pressures of volatile stable reaction products in the plasma with a reactant located in a glow discharge column for the manufacture of thin film semeconductors, wherein the temporal course of characteristic volatile hydrogen products of said semiconductors is traced and wherein the semiconductor material is SnO$_2$ or CuInSe$_2$.

* * * * *